United States Patent
Kim et al.

(10) Patent No.: US 8,299,477 B2
(45) Date of Patent: Oct. 30, 2012

(54) LIGHT EMITTING DEVICE AND METHOD FOR FABRICATING THE SAME

(75) Inventors: Geun Ho Kim, Seoul (KR); Yong Seon Song, Seoul (KR); Yu Ho Won, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 17 days.

(21) Appl. No.: 12/738,051

(22) PCT Filed: Oct. 13, 2008

(86) PCT No.: PCT/KR2008/006023
§ 371 (c)(1),
(2), (4) Date: Apr. 14, 2010

(87) PCT Pub. No.: WO2009/051376
PCT Pub. Date: Apr. 23, 2009

(65) Prior Publication Data
US 2010/0219432 A1    Sep. 2, 2010

(30) Foreign Application Priority Data
Oct. 15, 2007   (KR) .................. 10-2007-0103561

(51) Int. Cl.
*H01L 29/18* (2006.01)
(52) U.S. Cl. .............. 257/88; 257/E33.066; 257/91; 257/92; 257/93
(58) Field of Classification Search ........... 257/88, 257/E33.066, 91, 92, 93
See application file for complete search history.

(56) References Cited

U.S. PATENT DOCUMENTS

| | | |
|---|---|---|
| 7,417,259 B2 | 8/2008 | Sakai et al. |
| 2004/0056254 A1 | 3/2004 | Bader et al. |
| 2005/0062049 A1 | 3/2005 | Lin et al. |
| 2005/0253151 A1 | 11/2005 | Sakai et al. |
| 2006/0118800 A1* | 6/2006 | Kim ................. 257/98 |
| 2008/0251796 A1* | 10/2008 | Lee et al. .......... 257/88 |
| 2009/0008654 A1* | 1/2009 | Nagai ............... 257/88 |

FOREIGN PATENT DOCUMENTS

| | | |
|---|---|---|
| JP | 2004-006582 A | 1/2004 |
| KR | 10-0631129 B1 | 9/2006 |
| KR | 10-2006-0121454 A | 11/2006 |
| KR | 10-2007-0047058 A | 5/2007 |
| WO | WO 01/82384 A1 | 11/2001 |
| WO | WO 2005/013365 A2 | 2/2005 |
| WO | WO 2005/022654 A2 | 3/2005 |
| WO | WO 2006098545 A2 * | 9/2006 |

OTHER PUBLICATIONS

Machine translation of Kim (KR 10-2006-0121454).*

* cited by examiner

*Primary Examiner* — Lynne Gurley
*Assistant Examiner* — Hsin-Yi Hsieh
(74) *Attorney, Agent, or Firm* — Birch, Stewart, Kolasch & Birch, LLP

(57) ABSTRACT

A light emitting device that includes a conductive substrate, an insulating layer on the conductive substrate, a plurality of light emitting device cells on the insulating layer, a connection layer electrically interconnecting the light emitting device cells, a first contact section electrically connecting the conductive substrate with at least one light emitting device cell, and a second contact section on the at least one light emitting device cell.

6 Claims, 3 Drawing Sheets

[Fig. 1]
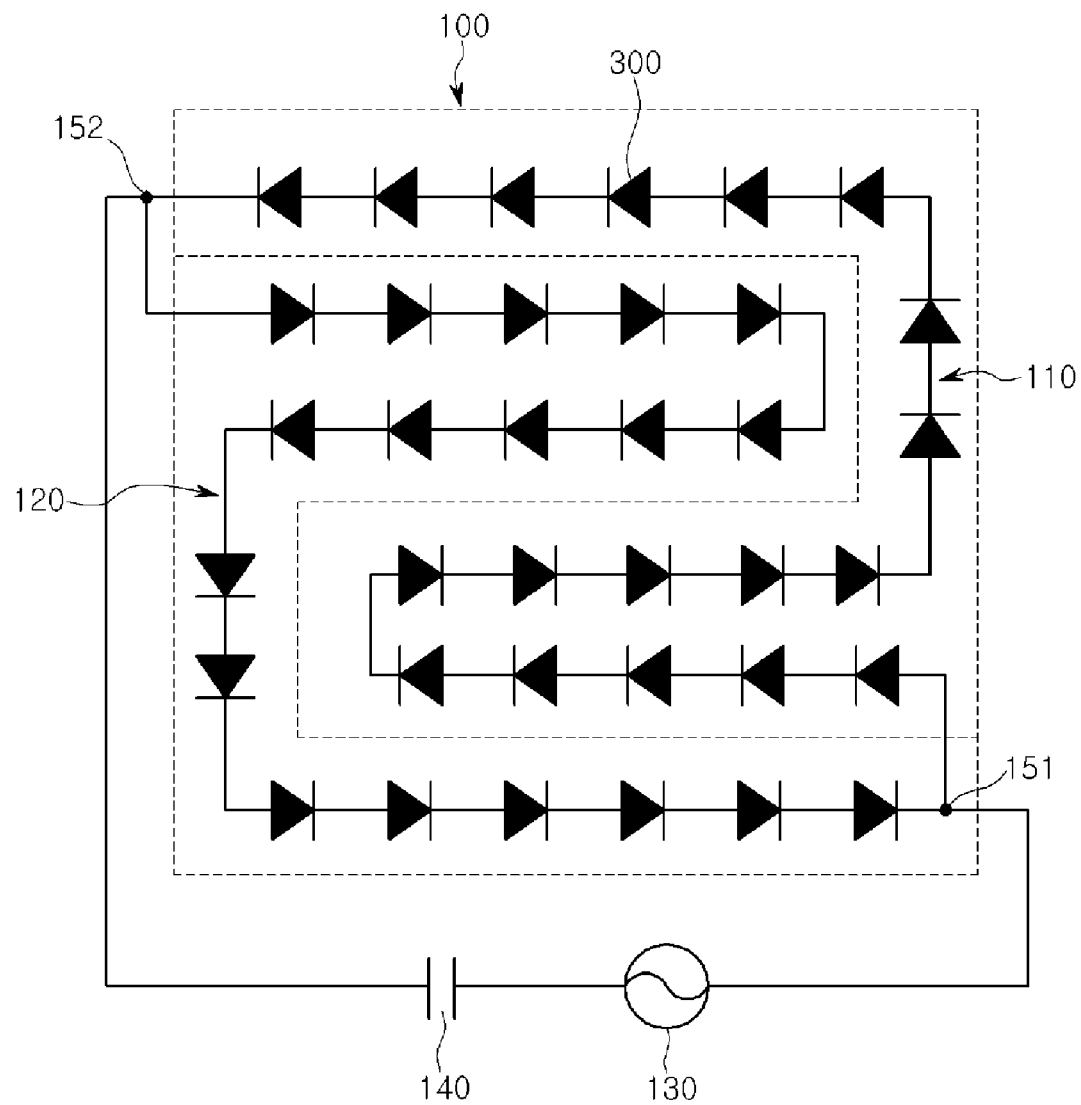
[Fig. 2]
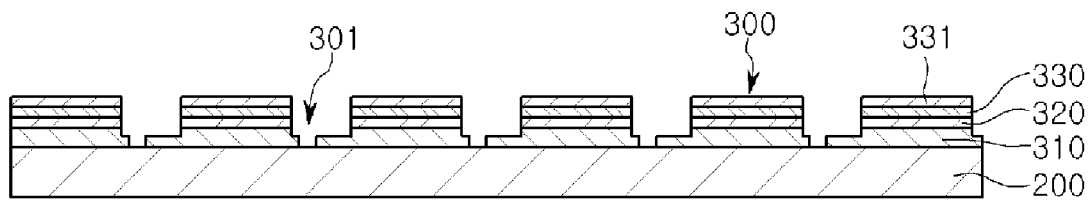
[Fig. 3]
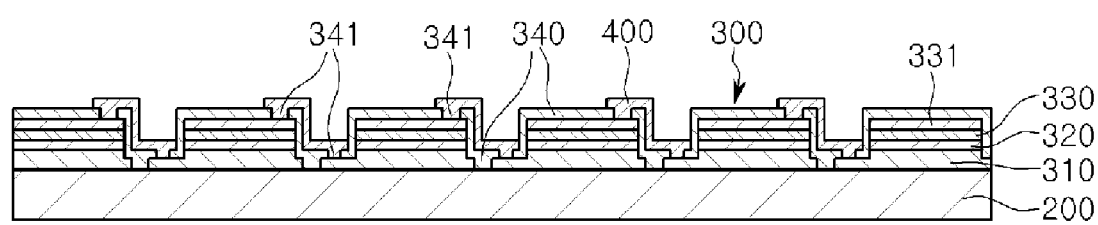

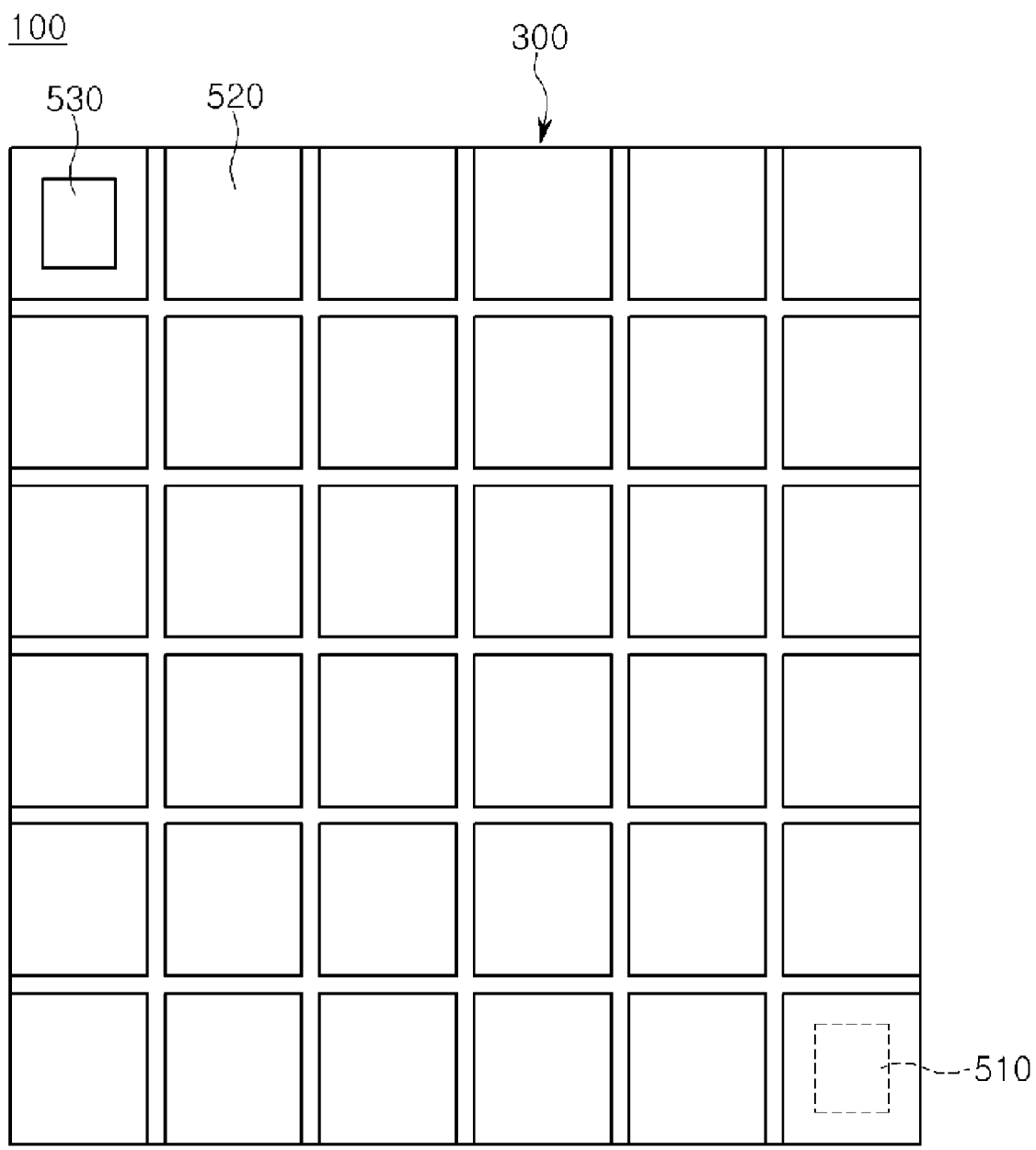
[Fig. 9]

LIGHT EMITTING DEVICE AND METHOD FOR FABRICATING THE SAME

TECHNICAL FIELD

The embodiment relates to a light emitting device and a method for fabricating the same.

BACKGROUND ART

An LED (light emitting diode) is a semiconductor light emitting device for converting electric current into light.

Wavelength of light emitted from such an LED varies depending on semiconductor material used for the LED. This is because the wavelength of the light varies depending on a bandgap of the semiconductor material, which represents energy gap between valence band electrons and conduction band electrons.

Recently, as luminance of the LED is gradually increased, the LED has been used as a light source for a displayer, illumination and a light source for a vehicle. An LED emitting white light with superior efficiency can be achieved by using fluorescent material or combining LEDs representing various colors.

DISCLOSURE OF INVENTION

Technical Problem

The embodiment provides a light emitting device having a novel structure and a method for fabricating the same.

The embodiment provides a light emitting device, which can be driven by an AC power, and a method for fabricating the same.

Technical Solution

In an embodiment, a light emitting device comprises a conductive substrate, an insulating layer on the conductive substrate, a plurality of light emitting device cells on the insulating layer, a connection layer electrically interconnecting the light emitting device cells, a first contact section electrically connecting the conductive substrate with at least one light emitting device cell, and a second contact section on the at least one light emitting device cell.

In an embodiment, a light emitting device comprises a conductive substrate, an insulating layer on the conductive substrate, a plurality of light emitting device cells electrically isolated from each other by the insulating layer, a connection layer electrically interconnecting the light emitting device cells, a first contact section electrically connecting the conductive substrate with at least one light emitting device cell by passing through the insulating layer, and a second contact section on the at least one light emitting device cell.

In an embodiment, a light emitting device comprises the steps of forming a first conductive semiconductor layer, an active layer and a second conductive semiconductor layer on a substrate, forming a plurality of light emitting device cells by selectively removing the first conductive semiconductor layer, the active layer and the second conductive semiconductor layer, forming a first insulating layer on the light emitting device cells to partially expose the first and second conductive semiconductor layers, forming a connection layer electrically connecting the first conductive semiconductor layer with the second conductive semiconductor layer such that the light emitting device cells are electrically interconnected, forming a second insulating layer on the first insulating layer, the light emitting device cells and the connection layer to partially expose the light emitting device cells, forming a first contact hole by selectively removing the second insulating layer, forming a first contact section in the first contact hole and forming a conductive substrate on the second insulating layer, and removing the substrate and forming a second contact section electrically connected with at least one light emitting device cell.

ADVANTAGEOUS EFFECTS

The embodiment can provide a light emitting device having a novel structure and a method for fabricating the same.

The embodiment can provide a light emitting device, which can be driven by an AC power, and a method for fabricating the same.

BRIEF DESCRIPTION OF DRAWINGS

FIG. 1 is a view showing a structure in which a light emitting device is electrically connected with an AC power according to an embodiment; and FIGS. 2 to 9 are sectional views illustrating a light emitting device and a method for fabricating the same according to an embodiment.

MODE FOR THE INVENTION

Figure 4:
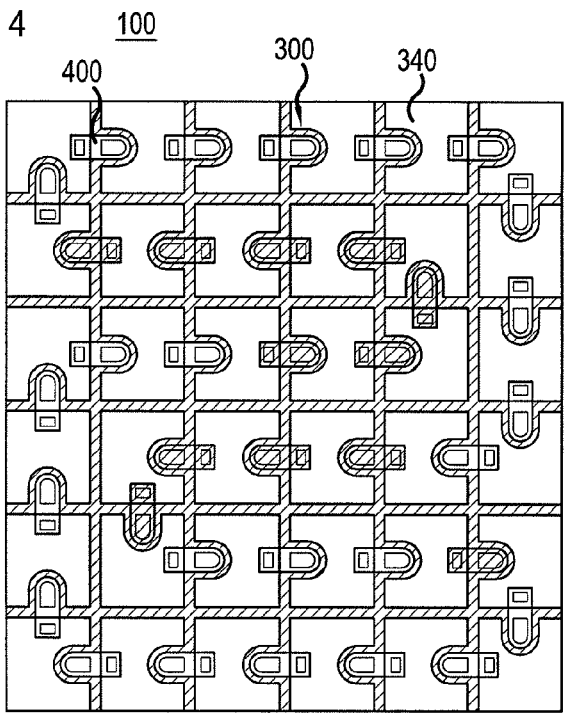

Hereinafter, an embodiment according to the present invention will be described in detail with reference to the accompanying drawings.

The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art.

The same reference numerals are used to designate the same elements throughout the drawings. In the drawings, the sizes and relative sizes of layers and regions may be exaggerated for clarity.

It will be understood that when an element such as a layer, a region or a substrate is referred to as being "on" or "under" another element, it can be directly on the other element or intervening elements may be present. When a part of an element such as a surface is referred to as a term "inner", it will be understood that the part is far away from a device as compared with other parts of the element.

It will be understood that such terms include other directions of the device in addition to the directions shown in the drawings. Last, when an element is referred to as being "directly on" another element, there are no intervening elements present. As used herein, the term "and/or" includes any and all combinations of one or more of the associated listed items.

FIG. 1 is a view showing a structure in which a light emitting device is electrically connected with an AC power according to an embodiment.

The light emitting device 100 according to the embodiment includes a first array block 110 having a plurality of light emitting device cells 300 serially connected with each other, and a second array block 120 having a plurality of light emitting device cells 300 serially connected with each other.

The first and second array blocks 110 and 120 are connected in parallel with each other at first and second nodes 151 and 152 to receive power from the AC power 130 such that the first and second array blocks 110 and 120 can be alternately driven by voltage supplied from the AC power 130. The light emitting device cells 300 in the first array block 110 have polarity arrangement inverse to that of the light emitting device cells 300 in the second array blocks 120 on the basis of the first and second nodes 151 and 152.

The number of the light emitting device cells 300 in the first array block 110 may be identical to the number of the light emitting device cells 300 in the second array blocks 120. Thus, even if the first and second array blocks 110 and 120 are alternately driven, luminance of light emitted from the light emitting device 100 is uniform.

The light emitting device cell 300 can be prepared in the form of a light emitting diode. For example, the light emitting diode may include a GaN-based semiconductor layer.

A capacitor 140 can be connected between the light emitting device 100 and the AC power 130 as a passive current limiting device. In addition, a device such as a resistor or an inductor can also be connected between the light emitting device 100 and the AC power 130.

FIGS. 2 to 9 are sectional views illustrating the light emitting device and a method for fabricating the same according to the embodiment.

Referring FIG. 2, a first conductive semiconductor layer 310, an active layer 320, a second conductive semiconductor layer 330 and an ohmic contact layer 331 are sequentially formed on a substrate 200, and the light emitting device cells 300 are formed by removing division areas 301.

For example, the substrate 200 may include a sapphire substrate, the first conductive semiconductor layer 310 may include a GaN-based semiconductor layer containing N type impurities, and the second conductive semiconductor layer 330 may include a GaN-based semiconductor layer containing P type impurities. Further, the active layer 320 may include a GaN-based semiconductor layer having a multiple quantum well structure.

The ohmic contact layer 331 can be selectively formed. The embodiment describes a case in which the ohmic contact layer 331 is formed.

The ohmic contact layer 331 may include an ohmic metal layer, an ohmic metal layer and a reflective metal layer, or a reflective metal layer having superior ohmic characteristics.

For example, the ohmic contact layer 331 may include an ohmic metal layer including Ni. Further, the ohmic contact layer 331 may be prepared in the form of a multilayer including an ohmic metal layer of Ni and a reflective metal layer containing at least one of Ag, an Ag-based alloy, Pd, Rh, or Pt. Furthermore, the ohmic contact layer 331 may be prepared in the form of a single layer or a multilayer by using a reflective metal layer containing at least one of Ag, an Ag-based alloy, Pd, Rh, or Pt. In addition, the ohmic contact layer 331 may include a transparent metal layer such as ITO (indium tin oxide).

Meanwhile, when the division area 301 is removed, an etch process of dividing the light emitting device cells 300 can be performed separately from an etch process of removing the active layer 320, the second conductive semiconductor layer 330 and the ohmic contact layer 331 such that the first conductive semiconductor layer 310 of the light emitting device cell 300 is exposed.

Referring FIG. 3, a first insulating layer 340 is formed on the substrate 200 including the light emitting device cells 300, and through holes 341 are formed by selectively etching the first insulating layer 340 such that the first conductive semiconductor layer 310 and the ohmic contact layer 331 are partially exposed. The first insulating layer 340 may serve as a passivation layer.

If the ohmic contact layer 331 is not formed, the first insulating layer 340 is selectively etched to partially expose the first and second conductive semiconductor layers 310 and 330.

Then, a metal pattern is formed on the substrate 200 including the light emitting device cells 300 to form a connection layer 400.

The connection layer 400 may include metal and electrically connects the ohmic contact layer 331 of the light emitting device cell 300 with the first conductive semiconductor layer 310 of an adjacent light emitting device cell 300 through the through hole 341.

The light emitting device cells 300 are serially connected with each other by the connection layer 400.

FIG. 4 is a plan view illustrating the light emitting device shown in FIG. 3.

Referring FIG. 4, in the light emitting device 100 according to the embodiment, the light emitting device cells 300 can be arranged in a matrix type while being spaced apart from each other, and can be electrically isolated by the first insulating layer 340.

Further, the adjacent light emitting device cells 300 can be electrically connected with each other by the connection layer 400.

Figure 5:
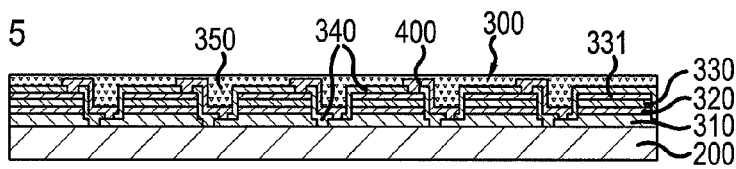

Referring FIG. 5, a second insulating layer 350 is formed on the substrate 200 including the light emitting device cells 300.

The second insulating layer 350 planarizes an upper structure of the substrate 200 including the light emitting device cells 300.

Further, the second insulating layer 350 isolates the connection layer 400 from a subsequently formed conductive substrate.

Figure 6:
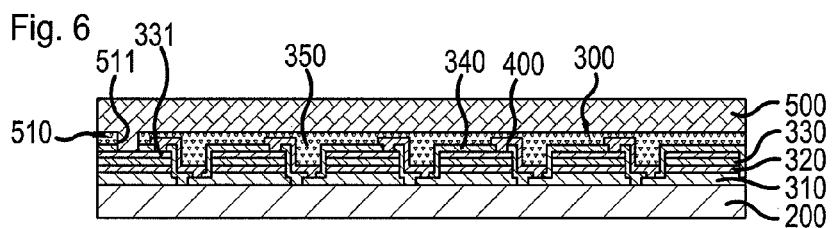

Referring FIG. 6, the second insulating layer 350 and the first insulating layer 340 are selectively removed to form a first contact hole 511. Then, a conductive substrate 500 is formed on the second insulating layer 350 including the first contact hole 511.

The conductive substrate 500 is electrically connected with the light emitting device cells 300 by a first contact section 510 formed in the first contact hole 511.

The conductive substrate 500 and the first contact section 510 connected with the conductive substrate 500 can be integrally formed with each other, and the conductive substrate 500 may include metal material.

In the embodiment, the first contact section 510 is electrically connected with the light emitting device cell 300 by making contact with the ohmic contact layer 331 after passing through the first and second insulating layers 340 and 350. Further, the first contact section 510 can also be electrically connected with the light emitting device cell 300 by making contact with the connection layer 400 after passing through the second insulating layer 350.

The first contact section 510 serves as the first node 151 shown in FIG. 1. A plurality of first contact sections 510 may be formed according to a design of the light emitting device 100.

The conductive substrate 500 and the first contact section 510 may be formed on the first contact hole 511 and the second insulating layer 350 through a plating process. When the conductive substrate 500 and the first contact section 510 are formed through the plating process, a seed layer or a bonding metal layer may be formed on the ohmic contact layer 331 and the second insulating layer 350.

In addition, the conductive substrate 500 and the first contact section 510 may be formed through a bonding process.

Figure 7:
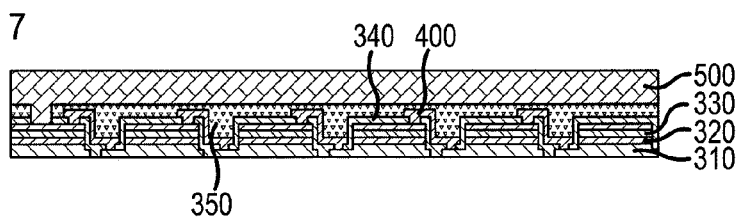

Referring FIG. 7, the substrate 200 is removed.

The conductive substrate 500 can support the light emitting device cells 300 when the substrate 200 is removed.

The substrate 200 can be separated from the light emitting device cells 300 by irradiating laser thereto or can be removed through a physical or chemical method.

If a buffer layer or an undoped GaN layer is formed between the substrate 200 and the first conductive semiconductor layer 310, the buffer layer and the undoped GaN layer can be removed together with the substrate 200.

Figure 8:
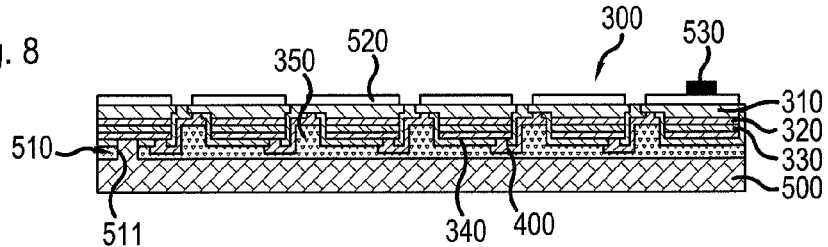

Referring FIG. 8, a second contact section 530 is formed on the first conductive semiconductor layer 310. The second contact section 530 serves as the second node 1 52 shown in FIG. 1.

Further, a transparent electrode layer 520 is formed on the first conductive semiconductor layer 310.

The transparent electrode layer 520 may include material having superior electrical conductivity as compared with the first conductive semiconductor layer 310. Thus, current applied to the adjacent light emitting device cells 300 through the first conductive semiconductor layer 310 can be applied to the transparent electrode layer 520, so that resistance due to the first conductive semiconductor layer 310 can be reduced.

Consequently, flow of the current between the adjacent light emitting device cells 300 can be facilitated.

The transparent electrode layer 520 may include ITO material.

The second contact section 530 is formed on the light emitting device cell 300 having no first contact section 510.

FIG. 9 is a plan view illustrating the light emitting device shown in FIG. 8.

Referring FIG. 9, the first contact section 510 is formed on the light emitting device cell 300 disposed at the right-most side of the lowermost portion of the light emitting device 100 and the second contact section 530 is formed on the light emitting device cell 300 disposed at the left-most side of the uppermost portion of the light emitting device 100.

As illustrated in FIG. 1, the light emitting device cells 300 are serially connected with each other, so that the first and second array blocks 110 and 120 are formed.

The light emitting device cells 300 included in the first and second array blocks 110 and 120 alternately generate light in response to power through the first and second contact sections 510 and 530.

The same number of the first and second contact sections 510 and 530 can be formed according to a circuit design of the light emitting device 100.

As described above, the first and second contact sections 510 and 530 are electrically connected with the AC power 130 as illustrated in FIG. 1, so that the light emitting device cells 300 of the first array block 110 are driven for a half-cycle of a sine wave applied from the AC power 130 and the light emitting device cells 300 of the second array block 120 are driven for a remaining half-cycle of the sine wave.

Thus, the light emitting device according to the embodiment can be efficiently driven by the AC power.

Although embodiments have been described with reference to a number of illustrative embodiments thereof, it should be understood that numerous other modifications and embodiments can be devised by those skilled in the art that will fall within the spirit and scope of the principles of this disclosure.

Industrial Applicability

The light emitting device package according to the embodiment can be used as a light source for various electronic appliances as well as illumination apparatuses.

The invention claimed is:

1. A light emitting device, comprising:
   a metallic layer;
   a plurality of light emitting device cells arranged above the metallic layer, and including a first conductive semiconductor layer, an active layer below the first conductive semiconductor layer, and a second conductive semiconductor layer below the active layer;
   a connection section connecting the light emitting device cells to each other in series;
   an insulating layer provided between the metallic layer and the light emitting device cells, and including a first insulating layer electrically insulating the light emitting device cells from each other and a second insulating layer insulating the connection section from the metallic layer;
   electrodes provided above the first conductive semiconductor layer of the light emitting device cells;
   a contact section connecting the second conductive semiconductor layer of the light emitting device cells to the metallic layer through a contact hole formed in the second insulting layer, and forming a first node; and
   a pad provided on at least one of the electrodes, and forming a second node,
   wherein each light emitting device cell is directly physically connected with the connection section through a hole formed in the first insulating layer, and
   wherein the electrodes are not in direct physical contact with the connection section.

2. The light emitting device of claim 1, further comprising a seed layer or a bond metallic layer interposed between the metallic layer and the second insulating layer.

3. The light emitting device of claim 1,
   wherein the first and second nodes are placed such that the light emitting device cells provided in a first array block are identical to the light emitting device cells provided in a second array block in number.

4. The light emitting device of claim 1, wherein the electrode includes a transparent electrode.

5. The light emitting device of claim 1, further comprising a transparent electrode layer on the first conductive semiconductor layer of the light emitting device cell.

6. The light emitting device of claim 1, wherein an AC power source and a current limiter passive element, which are connected to each other in series, are connected to the first and second nodes.

* * * * *